US 9,086,451 B2

(12) United States Patent
Wada et al.

(10) Patent No.: US 9,086,451 B2
(45) Date of Patent: Jul. 21, 2015

(54) SEMICONDUCTOR INTEGRATED CIRCUIT AND METHOD FOR DESIGNING THE SAME

(71) Applicant: Renesas Electronics Corporation, Kawasaki-shi, Kanagawa (JP)

(72) Inventors: Hiroki Wada, Kanagawa (JP); Yoichi Maeda, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 222 days.

(21) Appl. No.: 13/911,717

(22) Filed: Jun. 6, 2013

(65) Prior Publication Data

US 2013/0328583 A1  Dec. 12, 2013

(30) Foreign Application Priority Data

Jun. 6, 2012 (JP) ................................ 2012-128982

(51) Int. Cl.
*G01R 31/3187* (2006.01)
*G01R 31/28* (2006.01)
*G01R 31/3185* (2006.01)

(52) U.S. Cl.
CPC .... *G01R 31/2884* (2013.01); *G01R 31/318555* (2013.01); *G01R 31/318566* (2013.01)

(58) Field of Classification Search
CPC ........... G01R 31/2884; G01R 31/2831; G01R 31/318511; G01R 31/318533; G01R 31/318555; G01R 31/3187; G01R 31/40
See application file for complete search history.

(56) References Cited

U.S. PATENT DOCUMENTS

| 6,874,111 | B1 | 3/2005 | Adams et al. |
| 2003/0074618 | A1 | 4/2003 | Dorsey |
| 2004/0059959 | A1* | 3/2004 | Ozawa ............................ 714/30 |
| 2005/0034041 | A1* | 2/2005 | Casarsa .......................... 714/733 |

FOREIGN PATENT DOCUMENTS

| JP | 2003-208331 A | 7/2003 |
| JP | 2004-505395 T | 2/2004 |

* cited by examiner

*Primary Examiner* — Tung X Nguyen
(74) *Attorney, Agent, or Firm* — Miles & Stockbridge P.C.

(57) ABSTRACT

A power-on self-test circuit and a pattern generation circuit are provided. The power-on self-test circuit includes a selection circuit and a comparator circuit. The selection circuit selects, instead of an external pin group corresponding to a test access port, an output of the pattern generation circuit when a self-diagnosis execution signal is asserted and supplies a test pattern generated by the pattern generation circuit to a built-in self-test circuit. The comparator circuit compares a test result of a circuit-under-test with an expected value. By asserting the self-diagnosis execution signal in this manner, the semiconductor integrated circuit mounted on a user system executes BIST.

10 Claims, 8 Drawing Sheets

FIG. 3A
(MBIST TEST PATTERN FOR MASS PRODUCTION)

```
pattern RAMBIST (TCK, TRST, TMS, TDI, TDO)
vector(RunBist) := [ 1 1 1 0 X ];
vector(RunBist) := [ 1 1 0 0 X ];
vector(RunBist) := [ 1 1 0 0 X ];
vector(RunBist) := [ 1 1 0 1 0 ];
vector(RunBist) := [ 1 1 0 1 0 ];
vector(RunBist) := [ 1 1 0 0 0 ];
vector(RunBist) := [ 1 1 0 0 1 ];
vector(RunBist) := [ 1 1 0 1 1 ];
vector(RunBist) := [ 1 1 0 1 0 ];
vector(RunBist) := [ 1 1 0 0 1 ];
vector(RunBist) := [ 1 1 0 1 1 ];
vector(RunBist) := [ 1 1 0 0 1 ];
vector(RunBist) := [ 1 1 0 1 0 ];
vector(RunBist) := [ 1 1 1 0 X ];
vector(RunBist) := [ 1 1 0 0 X ];
```

FIG. 3B
(CORRESPONDING PATTERN ROM DATA)

| Addr. | q[4] TRST | q[3] TMS | q[2] TDI | q[1] TDOexpect | q[0] /Mask |
|---|---|---|---|---|---|
| n    | 1 | 1 | 0 | 0 | 0 |
| n+1  | 1 | 0 | 0 | 0 | 0 |
| n+2  | 1 | 0 | 0 | 0 | 0 |
| n+3  | 1 | 0 | 1 | 0 | 1 |
| n+4  | 1 | 0 | 1 | 0 | 1 |
| n+5  | 1 | 0 | 0 | 0 | 1 |
| n+6  | 1 | 0 | 0 | 1 | 1 |
| n+7  | 1 | 0 | 1 | 1 | 1 |
| n+8  | 1 | 0 | 1 | 0 | 1 |
| n+9  | 1 | 0 | 0 | 1 | 1 |
| n+10 | 1 | 0 | 1 | 1 | 1 |
| n+11 | 1 | 0 | 0 | 1 | 1 |
| n+12 | 1 | 0 | 1 | 0 | 1 |
| n+13 | 1 | 1 | 0 | 0 | 0 |
| n+14 | 1 | 0 | 0 | 0 | 0 |

| TDO | TDOexpect | /Mask |
|---|---|---|
| 0 | 0 | 1 |
| 1 | 1 | 1 |
| X | 0 | 0 |

FIG. 7

| Step | q[4] TRST | q[3] TMS | q[2] TDI | q[1] TDO expect | q[0] /Mask |
|---|---|---|---|---|---|
| n | 1 | 1 | 0 | 0 | 0 |
| n+1 | 1 | 0 | 0 | 0 | 0 |
| n+2 | 1 | 0 | 0 | 0 | 0 |
| n+3 | 1 | 0 | 1 | 0 | 0 |
| n+4 | 1 | 0 | 1 | 0 | 0 |
| n+5 | 1 | 0 | 0 | 0 | 1 |
| n+6 | 1 | 0 | 0 | 1 | 1 |
| n+7 | 1 | 0 | 0 | 1 | 1 |
| n+8 | 1 | 0 | 1 | 0 | 1 |
| n+9 | 1 | 0 | 0 | 1 | 1 |
| n+10 | 1 | 0 | 1 | 1 | 1 |
| n+11 | 1 | 0 | 0 | 1 | 1 |
| n+12 | 1 | 1 | 0 | 0 | 1 |
| n+13 | 1 | 1 | 0 | 0 | 0 |
| n+14 | 1 | 0 | 0 | 0 | 0 |

SEMICONDUCTOR INTEGRATED CIRCUIT AND METHOD FOR DESIGNING THE SAME

CROSS-REFERENCE TO RELATED APPLICATIONS

The disclosure of Japanese Patent Application No. 2012-128982 filed on Jun. 6, 2012 including the specification, drawings and abstract is incorporated herein by reference in its entirety.

BACKGROUND

The present invention relates to a semiconductor integrated circuit and a method for designing the semiconductor integrated circuit. Especially, when the semiconductor integrated circuit is on a system provided from a user (referred to as "user system") and needs to autonomously perform a self diagnosis, the semiconductor integrated circuit is suitably usable.

A standard method of boundary scan testing, which is one of the verification methods of semiconductor integrated circuits, is an IEEE standard 1149.1 (hereinafter, referred to as "JTAG"). A JTAG-compliant semiconductor integrated circuit includes, in addition to circuitry that performs originally intended functions, JTAG-compliant circuitry, and signal (TCK, TRST, TMS, TDI, TDO) pins corresponding to a test access port (TAP) of a JTAG interface.

One of the techniques of design for testability (DFT) for semiconductor integrated circuits is built-in self-testing (BIST). BIST is implemented with circuitry that generates test patterns and circuitry that compares test results and the expectations. BIST designed for memory is called "MBIST", and BIST designed for logic circuitry is called "LBIST".

Japanese Unexamined Patent Application Publication No. 2003-208331 discloses a method and a device for executing a memory built-in self-test and a logic built-in self-test on an integrated circuit device. According to the disclosure, a dual mode BIST controller includes a LBIST engine and a MBIST engine and executes at least one of the engines to obtain test results therefrom.

Japanese Unexamined Patent Application Publication (Translation of PCT Application) No. 2004-505395 discloses a technique of providing system initialization of microcode-based MBIST. In this disclosure, an integrated circuit with an embedded memory and a BIST architecture includes means for generating self-diagnostic test instructions.

SUMMARY

It is possible to incorporate a BIST function into a JTAG-compliant semiconductor integrated circuit. With the BIST function, functionality tests can be conducted by supplying signals in appropriate sequence to a controller in the semiconductor integrated circuit. When semiconductor integrated circuits are in a mass production stage, for instance, semiconductor automatic test equipment (ATE) supplies predetermined test patterns to TAPs of the semiconductor integrated circuits to execute BIST. After the tested semiconductor integrated circuit is mounted on a user system, the semiconductor integrated circuit needs to create test patterns to diagnose itself on the user system because the test patterns from the semiconductor automatic test equipment are not available. It is possible to execute BIST on semiconductor integrated circuits in a mass production stage with predetermined test patterns supplied from semiconductor automatic test equipment to TAPs and to execute BIST on the semiconductor integrated circuit mounted on a user system with test patterns created in the semiconductor integrated circuit; however, the inputs of the TAP controller need to be switched from one another.

Neither of the above-mentioned publications explicitly describes about the configuration of circuitry capable of readily executing BIST on a semiconductor integrated circuit mounted on a user system by using a BIST circuit controllable by a JTAG interface and the procedure of designing the semiconductor integrated circuit with the functions.

The further problems and novel features will more fully appear in the following detailed description and the accompanying drawings of the present specification.

The outline of a representative aspect of the invention for addressing the problems will be briefly described below.

The semiconductor integrated circuit includes a circuit-under-test, a test access port controller, a test access port corresponding to a JTAG interface, a built-in self-test circuit, a power-on self-test circuit, and a pattern generation circuit. The power-on self-test circuit includes a selection circuit and a comparator circuit. The selection circuit, instead of an external pin group corresponding to the test access port, selects an output of the pattern generation circuit when a self-diagnosis execution signal is asserted and supplies a test pattern generated by the pattern generation circuit to the built-in self-test circuit. The comparator circuit compares a test result of the circuit-under-test from the built-in self-test circuit with an expected value generated by the pattern generation circuit.

The effects obtained by the representative aspect of the invention for addressing the problems will be briefly described below.

In short, a BIST circuit controllable by a JTAG interface of a semiconductor integrated circuit can readily implement BIST on the semiconductor integrated circuit mounted on a user system.

BRIEF DESCRIPTION OF THE DRAWINGS

FIGS. 3A and 3B illustrate the relationship between a MBIST test pattern for mass production and data in a pattern ROM;

FIG. 7 illustrates the relationship between outputs of a fixed pattern generation circuit and outputs of a variable pattern generation circuit.

DETAILED DESCRIPTION

1. Outline

Figure 1:
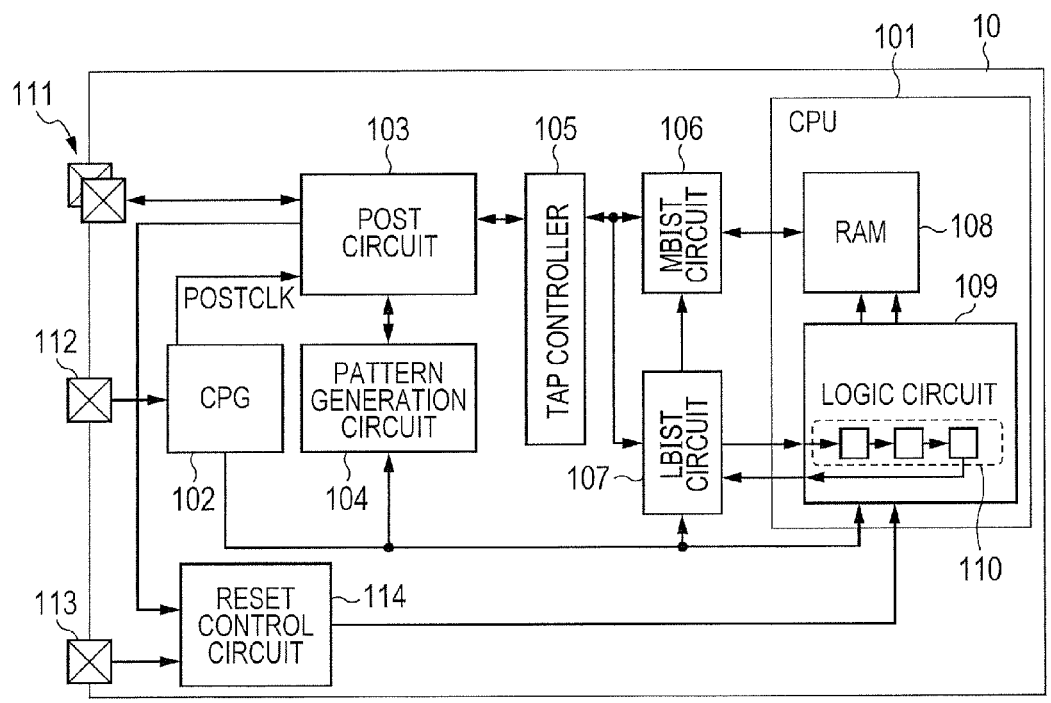
FIG. 1 is a block diagram of an exemplary configuration of a microcomputer as an example of a semiconductor integrated circuit.

To begin with, exemplary embodiments of the present invention disclosed herein are outlined. In the following general description of the exemplary embodiments, reference numerals in the drawings, which are given for referential purposes in parentheses, are only illustrative of elements that are included in the concepts of the components identified by the numerals.

[1] A semiconductor integrated circuit (10) according to an exemplary embodiment includes circuit-under-tests (108, 109), a test access port (111) corresponding to a JTAG interface, and a test access port controller (105) performing control functions of JTAG based on signals from the test access port. The semiconductor integrated circuit includes built-in self-test circuits (106, 107) that conduct tests on the circuit-under-tests under control of the test access port controller and a power-on self-test circuit (103) that is interposed between an external pin group corresponding to the test access port and the test access port controller and conducts power-on self tests on the circuit-under-tests. The semiconductor integrated circuit includes a pattern generation circuit (104) capable of generating test patterns used to self-diagnose the circuit-under-tests. Then, the power-on self-test circuit is composed of selection circuits (21, 22) and a comparator circuit (23). The selection circuit, instead of the external pin group corresponding to the test access port, selects an output of the pattern generation circuit when a self-diagnosis execution signal is asserted and supplies a test pattern generated by the pattern generation circuit to the built-in self-test circuit. The comparator circuit compares a test result of the circuit-under-test from the built-in self-test circuit with an expected value generated by the pattern generation circuit.

According to the above-described configuration, the selection circuit, instead of the external pin group corresponding to the test access port, selects an output of the pattern generation circuit when a self-diagnosis execution signal is asserted and supplies a test pattern generated by the pattern generation circuit to the built-in self-test circuit. The comparator circuit compares a test result of the circuit-under-test from the built-in self-test circuit with an expected value generated by the pattern generation circuit. Accordingly, the semiconductor integrated circuit mounted on a user system can implement BIST with a BIST circuit controllable by the JTAG interface of the semiconductor integrated circuit. In addition, the implementation of BIST on the semiconductor integrated circuit mounted on the user system can be achieved by asserting the self-diagnosis execution signal. This does not require initialization of the semiconductor integrated circuit and therefore is easy.

[2] In [1], when the pattern generation circuit for generating test patterns is disposed within the semiconductor integrated circuit, it is preferable to reduce the footprint of the pattern generation circuit on the chip as much as possible to prevent impairment of the original functionality of the semiconductor integrated circuit. The reduction of the footprint of the pattern generation circuit on the chip can be made by configuring the pattern generation circuit as follows.

The test pattern includes a fixed part independent of the configuration of the circuit-under-test and test conditions and a variable part dependent on the configuration of the circuit-under-test and test conditions. To achieve such a test pattern, the pattern generation circuit includes a fixed pattern generation circuit (61), a built-in self-test information circuit (63), and a variable pattern generation circuit (62). The fixed pattern generation circuit generates the fixed part of the test pattern through sequence operation. The built-in self-test information circuit outputs information for generating the variable part of the test pattern. The variable pattern generation circuit generates the variable part of the test pattern through sequence operation based on the information from the built-in self-test information circuit.

The fixed pattern generation circuit that is a fixed sequencer for generating the fixed part of test patterns can be directly implemented as a logic circuit. The variable pattern generation circuit creates test patterns based on built-in self-test information in the built-in self-test information circuit, resulting in a variable part of the test patterns. Because the most part of the test patterns is available through fixed sequence, the ratio of the variable part to the test patterns is lower than the fixed part. Therefore, the built-in self-test information circuit does not need a large storage space for the built-in self-test information that is used to generate the variable part of the test patterns.

[3] In [2], the pattern generation circuit can be provided with a logic circuit (64) that merges an output of the fixed pattern generation circuit with an output of the variable pattern generation circuit and supplies the merged output to the selection circuit. The logic circuit facilitates the merging of the output of the fixed pattern generation circuit with the output of the variable pattern generation circuit. The logic circuit can be implemented by an OR gate.

[4] In [3], assertion of the self-diagnosis execution signal permits the comparator circuit to exit from a reset state and then to compare the test result of the circuit-under-test and the expected test-result value. This allows the comparator circuit to start the operation with appropriate timing.

[5] In [4], the fixed pattern generation circuit can be configured to assert a self-diagnosis end signal, which is to be transferred to the CPU, upon completion of which the test patterns are generated. The CPU can recognize that the fixed pattern generation circuit has finished generating the test patterns with the assertion of the self-diagnosis end signal.

[6] In [5], a test pattern generated by the pattern generation circuit contains an expected value of a test result on the circuit-under-test and a mask value used to inhibit the comparing operation between the test result and the expected value. The comparator circuit can be configured to compare test results and the expected values with the mask value being negated. The comparator circuit configured as above does not compare test results and the expected values when the mask value is being asserted, thereby omitting a meaningless comparing operation.

[7] In [1], the pattern generation circuit can include a pattern ROM (25) in which test patterns are stored and a counter (24) that generates readout addresses used to retrieve the test patterns from the pattern ROM. Every time the counter generates a readout address, a corresponding test pattern is read out from the pattern ROM, thereby facilitating generation of the test patterns.

[8] In a method for designing the semiconductor integrated circuit according to an exemplary embodiment, the design of the semiconductor integrated circuit described in [1] is implemented by an operation unit (42) executing a first process (813), a second process (809, 811), and a third process (816). The first process is to generate a built-in self-test information circuit based on built-in self-test implementation information provided by software for incorporating the built-in self-test circuit. The second process is to generate a circuit for generating test patterns with the built-in self-test implementation information based on a specification of test-pattern generating software for built-in self-tests. The third process is to incorporate the circuits generated in the first process and second process to a circuit on which a built-in self-test is implemented.

According to the processes, the semiconductor integrated circuit disclosed in [1] can be readily designed.

[9] In [8], the second process includes a fourth process (809) of extracting specifications of the fixed pattern generation circuit and variable pattern generation circuit based on the specification of the test-pattern generating software for built-in self-tests and a fifth process (811) of generating the fixed pattern generation circuit and variable pattern generation circuit based on the specifications. The fourth process can be performed as follows.

First, a necessary algorithm is extracted from the specification of the test-pattern generating software for built-in self-tests (sixth process). Second, the algorithm extracted in the sixth process is divided into a fixed pattern generation part and a variable pattern generation part. A specification to read out the variable pattern generation part is added to the fixed pattern generation part, while a specification to read out built-in self-test information from the built-in self-test information circuit is added to the variable pattern generation part.

Through these processes, the specifications of the fixed pattern generation circuit and variable pattern generation circuit are extracted, and the fixed pattern generation circuit and the variable pattern generation circuit can be generated based on the extracted specifications.

[10] In [9], the test-pattern generating software for built-in self-tests is run by the aforementioned operation unit. The built-in self-test test-pattern generating software run by the operation unit generates test patterns to conduct built-in self-tests on the semiconductor integrated circuits in a mass production stage with the built-in self-test implementation information.

2. Detail

Further details of the embodiments will be provided.

First Embodiment

FIG. 1 illustrates a microcomputer as an example of a semiconductor integrated circuit.

The microcomputer 10 shown in FIG. 1 includes a central processing unit (CPU) 101, a clock pulse generator (CPG) 102, a power-on self-test (POST) circuit 103, a pattern generation circuit 104, a TAP controller 105, a memory BIST (MBIST) circuit 106, a logic BIST (LBIST) circuit 107, and a reset control circuit 114. The CPU 101 includes a RAM (Random Access Memory) 108 and a logic circuit 109. The logic circuit 109 includes scan registers 110 that conduct tests on the logic circuit 109 through the LBIST circuit 107. The microcomputer 10 also includes an external pin group (JTAG I/O) 111 corresponding to a TAP of a JTAG interface, a clock pin 112 used to couple to a crystal oscillator for generating clock pulses, and an external reset pin 113. During a test of microcomputers 10 in a mass production stage, the external pin group 111, clock pin 112, and external reset pin 113 are coupled to semiconductor automatic test equipment (ATE). This semiconductor automatic test equipment can supply TCK (Test Clock) signals, TRST (Test Reset) signals, TMS (Test Mode Select) signals, and TDI (Test Data Input) signals, each supported by the TAP of the JTAG interface, to the TAP controller 105.

The CPU 101 mounted on a user system executes predetermined computations by running programs. During the computations, the RAM 108 and logic circuit 109 are used for the computations and other operations as components of the CPU 101. The clock pulse generator 102 generates clock signals CLK used in this microcomputer 10. The generated clock signals CLK are fed to the POST circuit 103, pattern generation circuit 104, RAM 108, and logic circuit 109. The pattern generation circuit 104 generates test patterns used for self-diagnosis of the RAM 108 and logic circuit 109. The POST circuit 103 switches signals to be input to the TAP controller 105 and compares test results and expected values of the test results. The TAP controller 105 is a state machine that generates control signals, based on signals from the POST circuit, to perform JTAG functions.

The MBIST circuit 106 writes a test pattern into the RAM 108 through an access port of the RAM 108 and then reads out the written test pattern to execute MBIST. The LBIST circuit 107 applies a test pattern to the logic circuit 109 and reads out the output result by using the scan registers 110 in the logic circuit to execute LBIST. The test patterns and output results read out from the RAM 108 and logic circuit 109 serve as responses to the aforementioned test patterns and are transferred to the POST circuit 103 via the TAP controller 105.

The reset control circuit 114 has a function of asserting reset inputs of the CPU 101 when any self-diagnosis end signal generated by the external reset pin 113 and POST circuit 103 is asserted. Upon the completion of a power-on self test, control of the microcomputer 10 is returned to the CPU 101.

Figure 2:
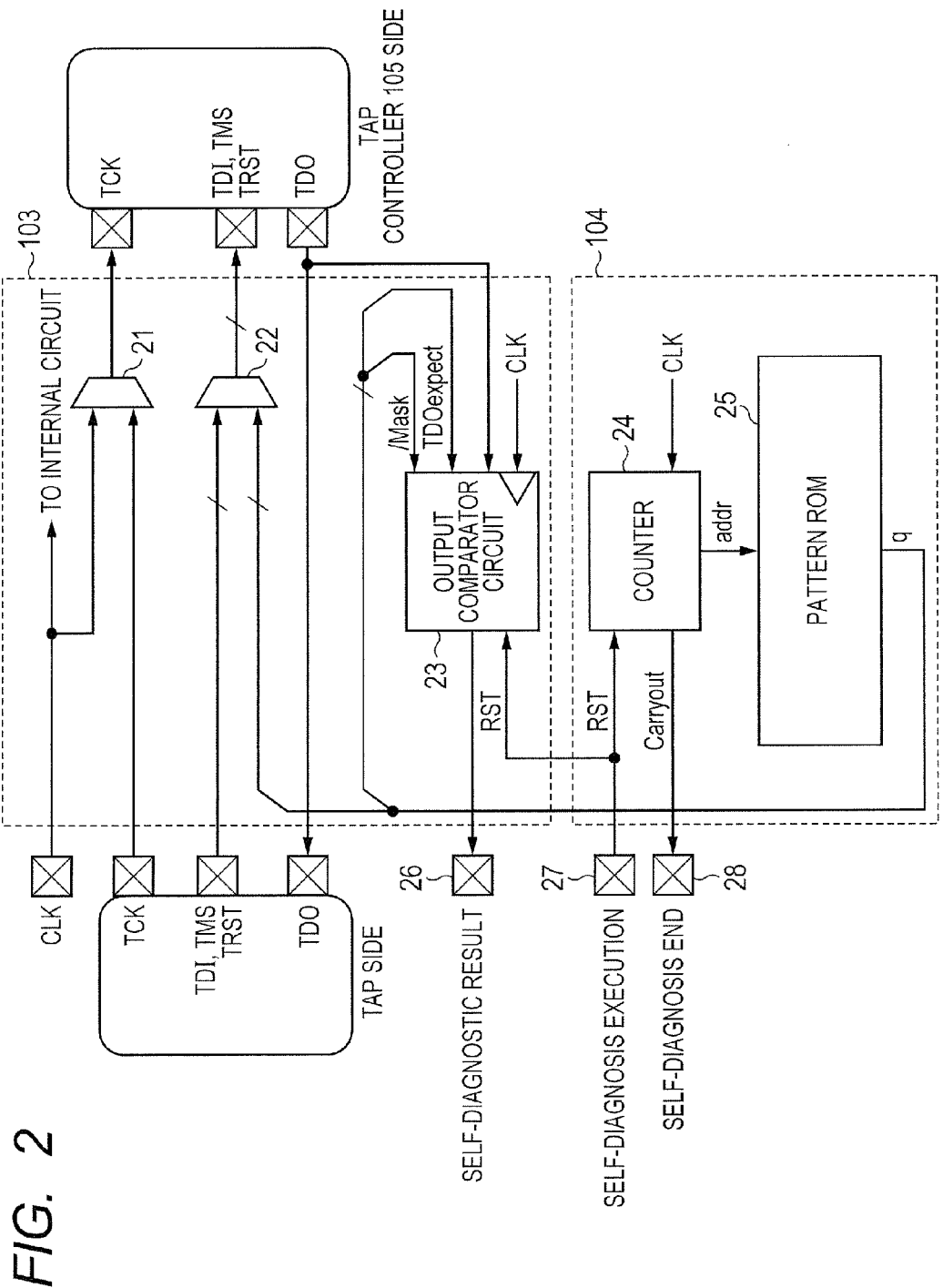
FIG. 2 is a block diagram of an exemplary configuration of a POST circuit and a pattern generation circuit in the microcomputer of FIG. 1.

FIG. 2 illustrates an exemplary configuration of the POST circuit 103 and pattern generation circuit 104.

The POST circuit 103 includes multiplexers 21, 22, functioning as selection circuits, and an output comparator circuit 23. The multiplexer 21 selectively transfers TCK signals on the TAP (external pin group 111) side and clock signals CLK fed from the pattern generation circuit 104 to the TAP controller 105. The multiplexer 22 selectively transfers TDI signals, TMS signals, and TRST signals on the TAP (external pin group 111) side and test patterns fed from the pattern generation circuit 104 to the TAP controller 105. Part of the test pattern (/MASK, TDOexpect) fed from the pattern generation circuit 104 is transferred to the output comparator circuit 23. The output comparator circuit 23 compares a TDO signal transferred from the TAP controller 105 with an expected value (TDOexpect) of the TDO signal when a /MASK signal is negated high. The comparison result is latched in a latch circuit in the output comparator circuit 23, while being transferred to the CPU 101 via a self-diagnostic result pin 26. If the /MASK signal is asserted low, the output comparator circuit 23 does not compare the TDO signal transferred from the TAP controller 105 with the expected value (TDOexpect). The latch circuit in the output comparator circuit 23 is configured to capture a self-diagnosis execution signal, which is fed from the CPU 101 via a self-diagnosis execution pin 27, as a reset signal RST and to exit from the reset state, for example, when the self-diagnosis execution pin 27 is asserted high to execute a self-diagnosis.

The pattern generation circuit 104 includes a counter 24 and a pattern ROM 25. The counter 24 counts clock signals CLK to increment the read address signal addr of the pattern ROM 25. The pattern ROM 25 stores test patterns used for testing the RAM 108 and logic circuit 109. These test patterns are read out in sequence in synchronism with updating of the read address signals addr generated by the counter 24. The output signal (test pattern) q of the pattern ROM 25 is transferred to the POST circuit 103. The counter 24 is configured to capture a self-diagnosis execution signal, which is fed from the CPU 101 via the self-diagnosis execution pin 27, as a reset signal RST and to exit from a reset state, for example, when the self-diagnosis execution pin 27 is asserted high to execute a self diagnosis. When the counter 24 counts up to the last address of the test patterns in the pattern ROM 25, the counter 24 quits generating read address signals addr for the pattern ROM 25 and asserts a self-diagnosis end signal (Carryout). This self-diagnosis end signal is transferred to the CPU 101 via the self-diagnosis end pin.

FIGS. 3A and 3B illustrate the relationship between MBIST test patterns for mass production and data in the pattern ROM 25.

In the MBIST test patterns for mass production, as shown in FIG. 3A, signals compliant with the TAP of the JTAG interface are defined as TCK, TRST, TMS, TDI, TDO in this order in each vector. For example, [1110X] represents TCK=1, TRST=1, TMS=1, TDI=0, and TDO=X. "1" is defined as high, "0" is defined as low, and "X" is logically undefined.

Semiconductor automatic test equipment (ATE) used to execute BIST for microcomputers 10 during a mass production stage has test patterns set as shown in FIG. 3A. In the BIST of the microcomputers 10 during the mass production stage, TCK signals, TRST signals, TMS signals, and TDI signals are supplied from the semiconductor automatic test equipment (ATE) to the TAP that then transfers the signals to the TAP controller 105 via the POST circuit 103 so that the MBIST circuit 106 and LBIST circuit 107 perform MBIST on the RAM 108 and LBIST on the logic circuit 109. The TDO signals obtained from the MBIST and LBIST are transferred to the semiconductor automatic test equipment (ATE) via the POST circuit 103 and are compared with their expected values.

As described above, TCK signals output from the semiconductor automatic test equipment (ATE) are used for the BIST of the microcomputers 10 during a mass production stage; however, in the case of BIST for microcomputers 10 mounted on user systems, clock signals CLK generated by the clock pulse generator 102 are used for the BIST because the semiconductor automatic test equipment (ATE) cannot be used. In addition, because comparison between the TDO signals obtained from MBIST and their expected values are performed by the output comparator circuit 23, the test patterns used for the BIST of the microcomputer 10 during a mass production stage cannot be used as they are. To solve the problems, the pattern ROM 25 stores data that is converted from the test patterns shown in FIG. 3A into those as shown in FIG. 3B. In the data shown in FIG. 3B, signals corresponding to "TCK" are omitted. In addition, "TDOexpect" and "/Mask" in FIG. 3B are created based on "TDO" in the test patterns shown in FIG. 3A. For example, if "TDO" is "0", "TDOexpect" is "0" and "/Mask" is "1". If "TDO" is "1", both "TDOexpect" and "/Mask" are "1". If "TDO" is "X", both "TDOexpect" and "/Mask" are "0". If "/Mask" is "0" in the output comparator circuit 23, the logical value of "TDOexpect" at that time is masked, and as a result, the comparison between "TDO" and "TDOexpect" is not performed. Therefore, meaningless comparisons can be dispensed with. In addition, if "/Mask" is "1" in the output comparator circuit 23, the logical value of "TDOexpect" at that time is not masked and "TDO" is compared with "TDOexpect".

The operation of the above-described configuration will be described.

In BIST on microcomputers 10 during a mass production stage, semiconductor automatic test equipment (ATE) for the microcomputers 10 is coupled to a group of the microcomputers 10 and supplies TCK signals, TRST signals, TMS signals, and TDI signals to a TAP. Then, a MBIST circuit 106 and a LBIST circuit 107 execute a memory test (MBIST) on a RAM 108 and a logic circuit test (LBIST) on a logic circuit 109, respectively. TDO signals obtained from the MBIST and LBIST are transferred to the semiconductor automatic test equipment via a POST circuit 103 and are compared with expected values of the TDO signals to determine whether the RAM 108 and logic circuit 109 operate properly.

After the microcomputers 10 are shipped and mounted on user systems, power-on self testing is conducted on the RAM 108 and logic circuit 109 whenever the user system is powered on. Specifically, every time the user system is powered on, a CPU 101 performs predetermined power-on reset processing. When a self-diagnosis execution signal (RST) supplied via a self-diagnosis execution pin 27 is asserted high through the power-on reset processing, an output comparator circuit 23 and counter 24 exit from a reset state. Then, a clock signal CLK from a clock pulse generator 102 is selected by a multiplexer 21 and is then transferred to a TAP controller 105, while a TDI signal, TMS signal, and TRST signal are selected from a test pattern from the pattern ROM 25 by a multiplexer 22 and are then transferred to the TAP controller 105. In the test pattern from the pattern ROM 25, a /Mask signal and TDOexpect signal are transferred to the output comparator circuit 23. The MBIST circuit 106 and LBIST circuit 107 conduct MBIST on the RAM 108 and LBIST on the logic circuit 109, respectively, under control of the TAP controller 105. The results of the MBIST and LBIST, or TDO signals, are transferred to the output comparator circuit 23 via the TAP controller 105. If the /Mask signal is negated high, the output comparator circuit 23 compares the TDO signals with expected TDO-signal values (TDOexpect). The comparison results are latched in a latch circuit in the output comparator circuit 23, while being transferred to the CPU 101 via a self-diagnostic result pin 26. If the self diagnosis results of MBIST or LBIST indicate normal, the CPU 101 continues processing; however, if the self diagnosis results of MBIST or LBIST indicate a failure, the CPU 101 can abort subsequent processing.

Next, a procedure of designing the microcomputer 10 with such a self diagnostic function will be described.

Figure 4:
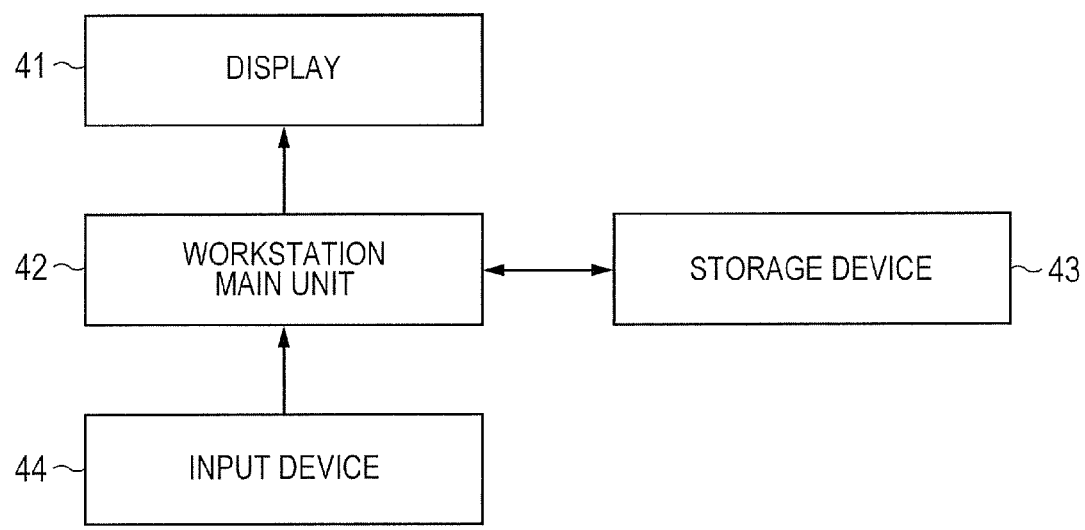
FIG. 4 is a block diagram of an exemplary configuration of a workstation used to design the microcomputer of FIG. 1.

FIG. 4 illustrates a workstation used to design the microcomputer 10.

The workstation 40 shown in FIG. 4 is not specifically limited to, but includes a display 41, a workstation main unit 42, a storage device 43, and an input device 44. The workstation main unit 42 including a CPU (central processing unit) to run predetermined programs is regarded as an example of an operation unit. The storage device 43 is, for example, a hard disk device that stores programs (software) run by the workstation main unit 42 and various types of information used to design the semiconductor integrated circuit 10. The programs run by the workstation main unit 42 include EDA (Electronic Design Automation) tools for designing the microcomputer 10. The input device 44 is, for example, a keyboard or a mouse through which the various types of information can be input to the workstation main unit 42 by operation of a designer of the semiconductor integrated circuit. The display 41 visualizes display data supplied from the workstation main unit 42.

Figure 5:
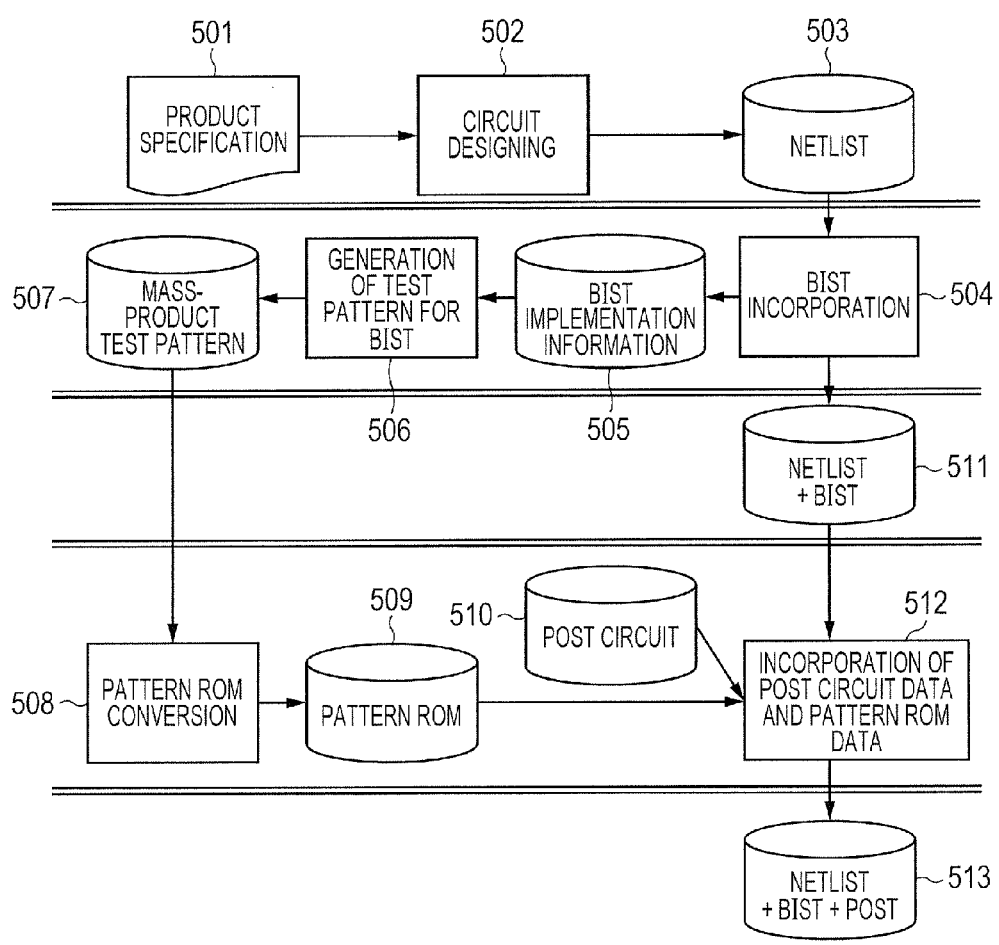
FIG. 5 is a flow chart of a designing process performed by the workstation.

FIG. 5 illustrates a design process flow performed on the workstation 40.

Once a product specification (501) of a microcomputer 10 is determined, circuits are designed (502) based on the specification, and a netlist (503) is created. This netlist is described in a hardware description language, "Verilog HDL".

After the creation of the netlist (503), a MBIST circuit 106 and LBIST circuit 107 are incorporated in the netlist (504). The incorporation of the BIST circuits provides a BIST-incorporated netlist (511).

After the incorporation of the BIST circuits, test patterns are generated (506) based on implementation information (505) of the MBIST circuit 106 and LBIST circuit 107. Through the test pattern generation, mass-product test patterns (507) used for BIST on the microcomputers 10 in a mass production stage are obtained. The mass-product test patterns (507) are transferred to the semiconductor automatic test equipment used for the BIST on the microcomputers 10 at the mass production stage. In addition, the mass-product test patterns (507) are subjected to pattern ROM conversion (508), thereby obtaining pattern ROM data (509) as shown in FIG. 3B.

Next, design data (510) of a POST circuit 103 and design data (509) of a pattern ROM 25 are incorporated into the BIST-incorporated netlist (511), thereby obtaining design data (513) of the microcomputer 10.

The first embodiment can achieve the following effects.

(1) During BIST on the microcomputers 10 in a mass production stage, the semiconductor automatic test equipment for the microcomputers 10 is coupled to the group of the semiconductor integrated circuits 109 and supplies TCK signals, TRST signals, TMS signals, and TDI signals to the TAP. Then the MBIST circuit 106 and LBIST circuit 107 execute MBIST on the RAM 108 and LBIST on the logic circuit 109, respectively. The TDO signals obtained from the MBIST and LBIST are transferred to the semiconductor automatic test equipment via the POST circuit 103 and are compared with the expected TDO-signal values to determine whether the RAM 108 and logic circuit 109 operate properly. After the microcomputers 10 are shipped and mounted on user systems, the CPU 101 performs predetermined power-on reset processing whenever the user system is powered on. Through this power-on reset processing, if a self-diagnosis execution signal (RST) fed via the self-diagnosis execution pin 27 is asserted high, the output comparator circuit 23 and counter 24 exit from the reset state. Then, when a /Mask signal is negated high, the TDO signals are compared with the expected values (TDOexpect), and the comparison results are latched in a latch circuit in the output comparator circuit 23, while being transferred to the CPU 101 via the self-diagnostic result pin 26. In short, the MBIST on the RAM 108 and LBIST on the logic circuit 109 are conducted after every power-on reset processing, thereby reflecting the test results on the subsequent processes of the CPU 101.

(2) The pattern generation circuit 104 of the first embodiment includes the pattern ROM 25 and counter 24, and test patterns in the pattern ROM 25 are read out in sequence whenever a read address signal addr generated by the counter 24 is updated, thereby continuously generating test patterns for MBIST and LBIST. In addition, the pattern ROM 25 stores data that is converted from the test patterns as shown in FIG. 3A into the test patterns as shown in FIG. 3B so as to be adaptable to the self diagnosis of the microcomputer 10, and the microcomputer 10 thereby can diagnose itself well with the data in the pattern ROM 25.

Second Embodiment

Figure 6:
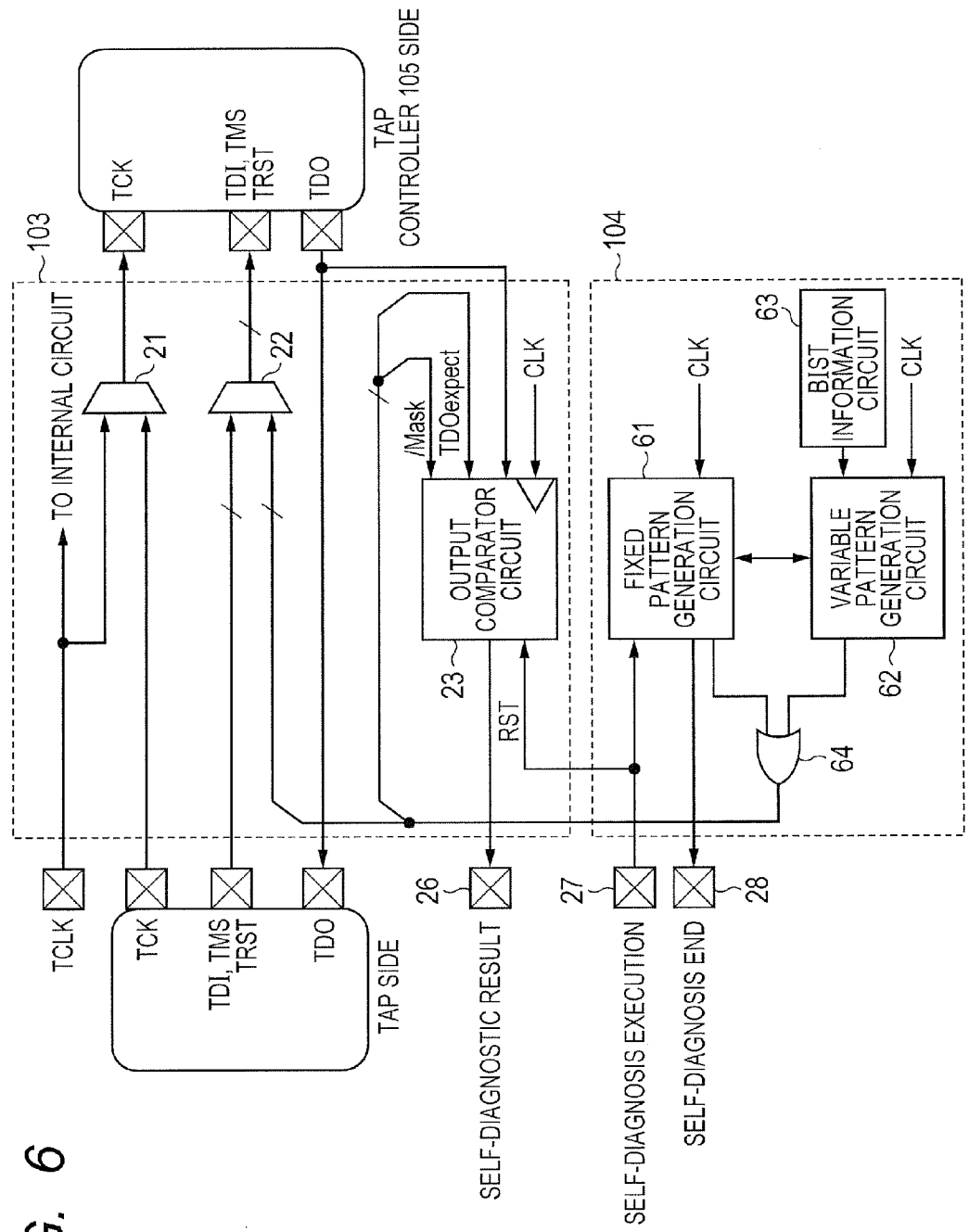
FIG. 6 is a block diagram of another exemplary configuration of the pattern generation circuit in the microcomputer of FIG. 1.

FIG. 6 illustrates another exemplary configuration of the pattern generation circuit 104. The significant difference of the pattern generation circuit 104 of FIG. 6 from that shown in FIG. 2 is that test patterns are generated by sequencers.

The pattern generation circuit 104 shown in FIG. 6 includes a fixed pattern generation circuit 61, a variable pattern generation circuit 62, a BIST information circuit 63, and an OR gate 64. The fixed pattern generation circuit 61 and variable pattern generation circuit 62 serves as sequencers that generate test patterns in a predetermined order or through a predetermined procedure.

The test patterns used for testing the RAM 108 and logic circuit 109 include a part that is independent of the circuit configuration of the RAM 108 and logic circuit 109 and test conditions (referred to as "fixed part") and a part that depends on the circuit configuration of the RAM 108 and logic circuit 109 and the test conditions (referred to as "variable part").

The fixed pattern generation circuit 61 operates as a fixed sequencer that generates the fixed part of the test patterns in synchronism with clock signals CLK and is implemented in the pattern generation circuit 104. When a self-diagnosis execution signal fed from the CPU 101 via the self-diagnosis execution pin 27 is, for example, asserted high to instruct executing a self diagnosis, the fixed pattern generation circuit 61 activates the function as a sequencer to start generating fixed patterns. Upon the fixed pattern generation circuit 61 outputs all predetermined test patterns, the fixed pattern generation circuit 61 asserts a self-diagnosis end signal via a self-diagnosis end pin 28.

The variable pattern generation circuit 62 creates test patterns, in synchronism with clock signals CLK, based on BIST information in the BIST information circuit 63, thereby generating a variable part of the test patterns. The BIST information in the BIST information circuit 63 is used to generate the variable part of the test patterns and includes information about the number of memory cells in the RAM 108 and logic circuit 109, types of the memory, address size, word size, etc.

The outputs of the fixed pattern generation circuit 61 and variable pattern generation circuit 62 are transferred through the OR gate 64 to the POST circuit 103 as an output of the pattern generation circuit 104. The outputs of the fixed pattern generation circuit 61 and variable pattern generation circuit 62 are merged as follows.

FIG. 7 shows the relationship between the output of the fixed pattern generation circuit 61 and the output of the variable pattern generation circuit 62.

The sequence operation of the fixed pattern generation circuit 61 and variable pattern generation circuit 62 is in synchronization with clock signals CLK. In The second embodiment, the sequence operation of the fixed pattern generation circuit 61 is assumed to include 15 steps, from n to n+14. Reference number 701 denotes test patterns generated by the fixed pattern generation circuit 61, and 702 denotes test patterns generated by the variable pattern generation circuit 62. In an example shown in FIG. 7, the test patterns 701 generated by the fixed pattern generation circuit 61 are merged with the test patterns 702 generated by the variable pattern generation circuit 62 in steps n+3 to n+12. Specifically, in the steps n+3 to n+12, TDI signals, TDOexpect signals, and /Mask signals in the test patterns 701 generated by the fixed pattern generation circuit 61 are omitted, and TDI signals, TDOexpect signals, and /Mask signals generated by the variable pattern generation circuit 62 are transferred to the POST circuit 103 via the OR gate 64 to make up for the omission.

More specific description about the merging of the test patterns will be made below.

When a self diagnosis execution signal is asserted high through the self-diagnosis execution pin 27, the fixed pattern generation circuit 61 starts generating fixed patterns. At this point, the variable pattern generation circuit 62 has not operated yet. During steps n+3 to n+12, the fixed pattern generation circuit 61 instructs the variable pattern generation circuit 62 to start operation at every step. With the instruction, the variable pattern generation circuit 62 generates a TDI signal, a TDOexpect single, a /Mask signal at every step based on the BIST information in the BIST information circuit 63 and outputs the signals to make up shortfalls of the test patterns 701. During steps n+13 and n+14, the fixed pattern generation circuit 62 does not instruct the variable pattern generation circuit 62 to start operation, and therefore the variable pattern generation circuit 62 does not generate test patterns.

The operational effects of the above configuration will be described.

(1) As with the case of the first embodiment, the CPU 101 performs predetermined power-on reset processing whenever the user system is powered on. Through this power-on reset processing, if a self-diagnosis execution signal (RST) fed via the self-diagnosis execution pin 27 is asserted high, the output comparator circuit 23 exits from the reset state. Then, the multiplexer 21 selects a clock signal CLK from the clock pulse generator 102 and transfers the selected signal to the TAP controller 105, while the multiplexer 22 selects a TDI signal, TMS signal, and TRST signal in a test pattern generated by the fixed pattern generation circuit 61 or variable pattern generation circuit 62 and transfers the selected signals to the TAP controller 105. In the test pattern from the fixed pattern generation circuit 61 or variable pattern generation circuit 62, a /Mask signal and TDOexpect signal are transferred to the output comparator circuit 23. The MBIST circuit 106 and LBIST circuit 107 execute MBIST on the RAM 108 and LBIST on the logic circuit 109, respectively, under control of the TAP controller 105. The results of the MBIST and LBIST, or TDO signals, are transferred to the output comparator circuit 23 via the TAP controller 105. If the /Mask signal is negated high, the output comparator circuit 23 compares the TDO signals with the expected TDO-signal values (TDOexpect). The comparison results are latched in a latch circuit in the output comparator circuit 23, while being transferred to the CPU 101 via the self-diagnostic result pin 26. If the self diagnosis results of MBIST or LBIST indicate normal, the CPU 101 continues processing; however, if the self diagnosis results of MBIST or LBIST indicate a failure, the CPU 101 can abort subsequent processing.

(2) The pattern generation circuit 104 includes the fixed pattern generation circuit 61 and variable pattern generation circuit 62 both being configured to generate test patterns in sequence, thereby reducing the footprint of the pattern generation circuit on a chip.

Since the fixed pattern generation circuit 61 is a fixed sequencer for generating the fixed part of the test patterns, the fixed pattern generation circuit 61 can be directly implemented as a logic circuit.

The variable pattern generation circuit 62 creates test patterns based on the BIST information in the BIST information circuit 63, resulting in a variable part of the test patterns. Because most part of the test patterns is available through the fixed sequence, the ratio of the variable part to the test patterns is lower than the fixed part. Therefore, the BIST information circuit 63 does not need a large storage space for the BIST information that is used to generate the variable part of the test patterns.

For example, the circuit scale in the case of employing the configuration shown in FIG. 2 and the circuit scale in the case of employing the configuration shown in FIG. 6 are estimated and the results will be shown below.

The circuit scale of the configuration shown in FIG. 2 is estimated under the conditions where the test pattern is 2,487,000 bits (497,000 steps) in length and the number of transistors per 1 bit in the pattern ROM 25 is 1.005, and the estimated number of the transistors is 2,500,000.

On the contrary, if the configuration shown in FIG. 6 is employed, the circuit scale that can generate test patterns of 2,487,000 bits in length is assumed to be approximately 10,500 Gates. When the number of transistors per 1 gate is assumed to be "6", the total number of the transistors is 65,000, which is significantly fewer than that of the configuration of FIG. 2. The estimation demonstrates that the footprint of the pattern generation circuit 104 configured as shown in FIG. 6 on a chip can be reduced in comparison with that shown in FIG. 2.

(3) A pattern sequence generated by the fixed pattern generation circuit 61 is a fixed part that is independent of the configuration of circuits under test, i.e., the RAM 108 and logic circuit 109, and the test conditions, and therefore the fixed pattern generation circuit 61 does not need to be modified even if a circuit-under-test is changed to another. When the circuit-under-test is changed to another, generation of a pattern sequence according to the change of the circuit-under-test can be compensated for by changing only the content of the BIST information circuit 63. The number of man-hours to incorporate self-diagnostic functions to deal with the change of the circuit-under-test can be significantly reduced in comparison with the case of employing the configuration in FIG. 2.

Next, a procedure of designing the microcomputer 10 with such a self diagnostic function will be described.

Figure 8:
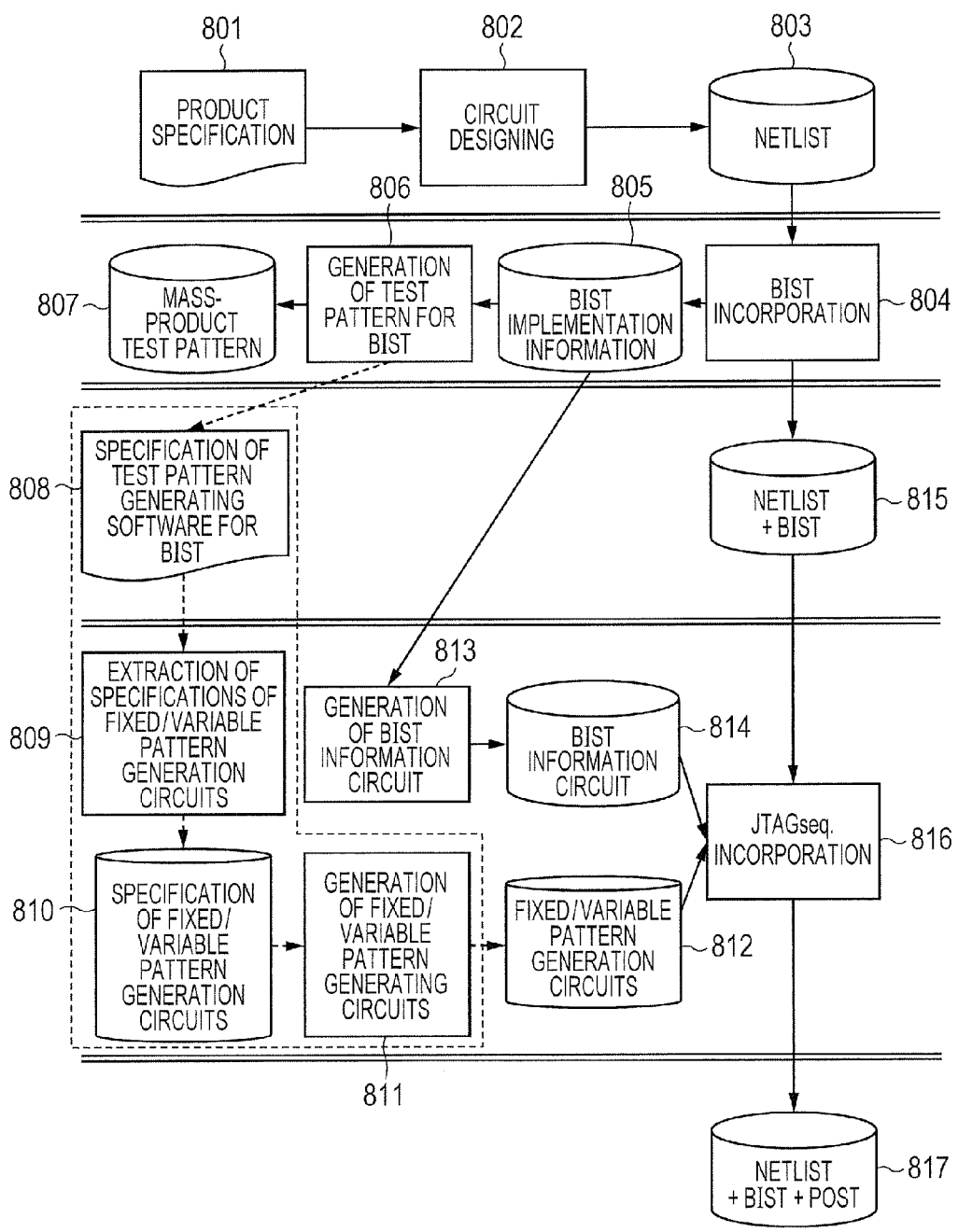
FIG. 8 is a flow chart of a designing process performed by the workstation.

FIG. 8 illustrates a design process flow of the microcomputer 10 configured as shown in FIG. 6. This design processing is carried out on a workstation 40 as shown in FIG. 4.

As with the case of the procedure shown in FIG. 5, once a product specification (801) of the microcomputer 10 is determined, circuits are designed (802) based on the specification, and a netlist (803) is created. This netlist is described in a hardware description language, "Verilog HDL". After the creation of the netlist (803), a MBIST circuit 106 and LBIST circuit 107 are incorporated in the netlist (804). The incorporation of the MBIST circuit 106 and LBIST circuit 107 provides a BIST-incorporated netlist (815).

In addition, as shown in FIG. 5, after the incorporation of the MBIST circuit 106 and LBIST circuit 107, test patterns are generated (806) based on implementation information (805) of the MBIST circuit 106 and LBIST circuit 107. Through the test pattern generation, mass-product test patterns (507) used for BIST on the microcomputers 10 in a mass production stage are obtained. The mass-product test patterns (507) are transferred to semiconductor automatic test equipment used for conducting BIST on the microcomputers 10 at the mass production stage.

The specifications of the fixed pattern generation circuit 61 and variable pattern generation circuit 62 are provided from software used to generate the test patterns (806). Specifically, a specification of the fixed pattern generation circuit 61 and a specification of the variable pattern generation circuit 62 are extracted (809) from a specification (808) of the software used to generate test patterns for BIST (806).

Extraction of the specifications of the fixed pattern generation circuit 61 and variable pattern generation circuit 62 (809) begins with extraction of a necessary algorithm from the specification of test-pattern generating software for BIST, and the extracted algorithm is divided into a fixed pattern generation part and a variable pattern generation part. The fixed pattern generation part corresponds to the fixed pattern generation circuit 61, while the variable pattern generation part corresponds to the variable pattern generation circuit 62. Then, a specification used to invoke the variable pattern generation part is added to the fixed pattern generation part, while a specification used to read out the BIST information from the BIST information circuit is added to the variable pattern generation part. In this manner, the specifications of the fixed pattern generation circuit 61 and the variable pattern generation circuit 62 are obtained (810).

A BIST system controlled through the JTAG interface has a pattern composed of the following two types of successive sub-patterns.

A first sub-pattern is a part used to make state transitions of the TAP controller in a specific order (test executing part, etc.). A second sub-pattern is a part used to scan, more specifically to set values and observe a test data register (TDR) attached to the TAP controller (test condition setting part, test result reading part, etc.).

The order in which the sub-patterns appear, the sub-pattern for making state transitions of the TAP controller in a specific order and so on are in principle unique to the BIST system and are not different from product to product, and therefore can be generated from specifications of BIST system pattern generators and are implemented in the fixed pattern generation circuit.

Although the bit width, write value, and read value of TDRs vary depending on the product, a procedure of translating the BIST implementation information into these values can be specified based on the specifications of the BIST pattern generators, and therefore the procedure is implemented as the variable pattern generation circuit 62. The BIST implementation information is stored in the BIST information circuit 63 so that the variable pattern generation circuit 62 can refer thereto.

The fixed pattern generation circuit 61 is generated based on the specification of the fixed pattern generation circuit 61, while the variable pattern generation circuit 62 is generated based on the specification of the variable pattern generation circuit 62 (811). In this manner, the design data of the fixed pattern generation circuit 61 and the design data of the variable pattern generation circuit 62 can be obtained (812).

As long as the BIST and test contents do not change significantly, the configuration of the fixed pattern generation circuit 61 and variable pattern generation circuit 62 do not change. If there is no change in the configuration, the specification of the fixed pattern generation circuit 61 and the specification of the variable pattern generation circuit 62 (810) can be shared among a plurality of products.

The information of the BIST information circuit 63, which outputs BIST information, is provided from the software used to incorporate BIST (804). In other words, the BIST information circuit 63 is generated (813) based on the BIST implementation information (805) obtained through the incorporation of the BIST (804).

The generation of the BIST information circuit 63 involves firstly selecting necessary information pieces from the BIST implementation information and secondly assigning an independent integer to each of the selected BIST implementation information pieces. In this manner, a circuit that outputs BIST implementation information pieces corresponding to the integers is generated.

Then, the design data (814) of the BIST information circuit 63, the design data of the fixed pattern generation circuit 61, and the design data of the variable pattern generation circuit 62 are incorporated (816) in a BIST-incorporated netlist (815), thereby obtaining design data (817) of the microcomputer 10 having the configuration shown in FIG. 6.

The extraction of the specifications of the fixed pattern generation circuit 61 and variable pattern generation circuit 62 (809) and the generation of the fixed pattern generation circuit 61 and the variable pattern generation circuit 62 (811) are performed only once in a BIST system. If products have the same BIST systems, the design data of the fixed pattern generation circuit 61 and the design data of the variable pattern generation circuit 62 (812) can be shared among the products, which is advantageous to reduce the number of designing steps. Even in the case where the BIST systems are different, if the design data of the fixed pattern generation circuit 61 is not required to be changed, the design data can be used as it is, which is also advantageous in reducing the number of the designing steps.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A semiconductor integrated circuit comprising:
a circuit-under-test;
a test access port corresponding to a JTAG interface;
a test access port controller performing control functions of JTAG based on signals from the test access port;
a built-in self-test circuit conducting a test on the circuit-under-test under control of the test access port controller;
a power-on self-test circuit interposed between an external pin group corresponding to the test access port and the test access port controller and conducting a power-on self test on the circuit-under-test; and
a pattern generation circuit capable of generating test patterns used to self-diagnose the circuit-under-test,
wherein the power-on self-test circuit includes:
a selection circuit selecting an output of the pattern generation circuit, instead of the external pin group corresponding to the test access port, when a self-diagnosis execution signal is asserted to supply a test pattern generated by the pattern generation circuit to the built-in self-test circuit; and
a comparator circuit comparing a test result of the circuit-under-test from the built-in self-test circuit with an expected value generated by the pattern generation circuit.

2. The semiconductor integrated circuit according to claim 1,
wherein the test pattern includes a fixed part independent of the configuration of the circuit-under-test and test conditions and a variable part dependent on the configuration of the circuit-under-test and test conditions,
wherein the pattern generation circuit includes:
a fixed pattern generation circuit generating the fixed part of the test pattern through sequence operation;
a built-in self-test information circuit outputting information for generating the variable part of the test pattern; and
a variable pattern generation circuit generating the variable part of the test pattern through sequence operation based on the information from the built-in self-test information circuit.

3. The semiconductor integrated circuit according to claim 2,
wherein The pattern generation circuit includes a logic circuit merging an output of the fixed pattern generation circuit with an output of the variable pattern generation circuit and supplies the merged output to the selection circuit.

4. The semiconductor integrated circuit according to claim 3,
wherein when the self-diagnosis execution signal is asserted, the comparator circuit exits from a reset state and compares the test result of the circuit-under-test with the expected value.

5. The semiconductor integrated circuit according to claim 4,
wherein the fixed pattern generation circuit asserts a self-diagnosis end signal to be transferred to a CPU upon completion of which the test pattern is generated.

6. The semiconductor integrated circuit according to claim 1,
wherein the test pattern generated by the pattern generation circuit includes an expected value of the test result of the circuit-under-test and a mask value inhibiting comparing operation between the test result and the expected value, and
wherein the comparator circuit compares the test result and the expected value when the mask value is negated.

7. The semiconductor integrated circuit according to claim 1,
wherein the pattern generation circuit includes:
a pattern ROM in which the test pattern is stored; and
a counter generating an address to read out a test pattern from the pattern ROM.

8. A method for designing a semiconductor integrated circuit,
the circuit including:
a circuit-under-test;
a test access port corresponding to a JTAG interface;
a test access port controller performing control functions of JTAG based on signals from the test access port;
a built-in self-test circuit conducting a test on the circuit-under-test under control of the test access port controller;
a power-on self-test circuit interposed between an external pin group corresponding to the test access port and the test access port controller and conducting a power-on self test on the circuit-under-test; and
a pattern generation circuit capable of generating test patterns used to self-diagnose the circuit-under-test,
the power-on self-test circuit having:
a selection circuit that selects an output of the pattern generation circuit, instead of the external pin group corresponding to the test access port, when a self-diagnosis execution signal is asserted to supply a test pattern generated by the pattern generation circuit to the built-in self-test circuit; and
a comparator circuit that compares a test result of the circuit-under-test from the built-in self-test circuit with an expected value generated by the pattern generation circuit,
the method executed by an operation unit comprising:
a first process of generating a built-in self-test information circuit based on BIST implementation information provided from software for incorporating the built-in self-test circuit;
a second process of generating a circuit, which generates a test pattern by using the built-in self-test implementation information, based on a specification of test-pattern generating software for built-in self-tests; and
a third process of incorporating the circuits generated in the first process and the second process into a circuit on which a built-in self-test is implemented.

9. The method for designing the semiconductor integrated circuit according to claim 8,
wherein the second process includes:
a fourth process of extracting specifications of the fixed pattern generation circuit and the variable pattern generation circuit based on the specification of the test-pattern generating software for built-in self-tests; and
a fifth process of generating the fixed pattern generation circuit and the variable pattern generation circuit based on the specifications extracted in the fourth process, and
wherein the fourth process includes:
a sixth process of extracting a necessary algorithm from the specification of the test-pattern generating software for built-in self-tests;
a seventh process of dividing the algorithm extracted in the sixth process into a fixed pattern generation part and a variable pattern generation part; and
an eighth process of adding a specification used to read the variable pattern generation part to the fixed pattern generation part and adding a specification used to read built-in self-test information from the built-in self-test information circuit to the variable pattern generation part.

10. The method for designing the semiconductor integrated circuit according to claim 9,
wherein the test-pattern generating software for built-in self-tests is executed by the operation unit to generate a test pattern used to conduct a built-in self-test on the semiconductor integrated circuit during a mass production stage with the built-in self-test implementation information.

* * * * *